United States Patent
Light et al.

(10) Patent No.: US 7,309,447 B2
(45) Date of Patent: Dec. 18, 2007

(54) METHOD FOR MAKING A MICROELECTRONIC PACKAGE USING PRE-PATTERNED, REUSABLE MOLD AND METHOD FOR MAKING THE MOLD

(75) Inventors: David Light, Los Gatos, CA (US); Masud Beroz, Livermore, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/771,252

(22) Filed: Feb. 3, 2004

(65) Prior Publication Data

US 2004/0224535 A1    Nov. 11, 2004

Related U.S. Application Data

(60) Provisional application No. 60/444,461, filed on Feb. 3, 2003.

(51) Int. Cl.
*B44C 1/22* (2006.01)
(52) U.S. Cl. .............................. 216/32; 216/41; 216/83; 216/100; 264/319

(58) Field of Classification Search .................. 216/32, 216/41, 83, 100; 264/319
See application file for complete search history.

(56) References Cited

U.S. PATENT DOCUMENTS

| 4,567,123 | A | * | 1/1986 | Ohtaka et al. ................... 430/4 |
| H000788 | H | * | 6/1990 | Schneider, Jr. ................ 216/35 |
| 5,325,583 | A | * | 7/1994 | Shimizu et al. ................ 29/849 |
| 5,633,529 | A | * | 5/1997 | Otsuki ......................... 257/666 |
| 6,285,086 | B1 | * | 9/2001 | Sota et al. .................... 257/786 |
| 6,537,459 | B1 | * | 3/2003 | Dufresne et al. .............. 216/8 |

FOREIGN PATENT DOCUMENTS

| JP | 03-251395 | * 11/1991 |
| JP | 2002-321337 | * 11/2002 |

* cited by examiner

*Primary Examiner*—Shamim Ahmed
(74) *Attorney, Agent, or Firm*—Lerner, David, Littenberg, Krumholz & Mentlik, LLP (57) ABSTRACT

A method for making a reusable mold for forming a microelectronic element package. The method including the steps of removing material from portions of a base to form recesses in the base and then depositing a mask material on at least some portions of the base.

12 Claims, 9 Drawing Sheets

METHOD FOR MAKING A MICROELECTRONIC PACKAGE USING PRE-PATTERNED, REUSABLE MOLD AND METHOD FOR MAKING THE MOLD

CROSS-REFERENCE TO RELATED APPLICATIONS

The application claims the benefits of U.S. Provisional Application No. 60/444,461 filed on Feb. 3, 2003, the disclosure of which is incorporated by reference herein.

BACKGROUND OF THE INVENTION

The present invention relates to methods of making microelectronic packages, apparatus therefor, and methods of making apparatus therefor.

The semiconductor chip packaging industry is a highly competitive business in which the packaging companies are waging an ongoing battle to reduce the costs associated with packaging their own chips and, many times, the chips owned by other parties. New technologies are constantly being investigated in order to reduce the packaging cost while producing packaging structures and processes which produce similar or superior results. Further, there is on-going pressure from the electronic industry to reduce the internal impedances of semiconductor packages so that the semiconductor makers may increase the speed of their chips without experiencing significant signal degradation thereby decreasing the processing and/or response time a user of a finished electronic product will encounter when requesting the electronic product to perform a given task. Further still, the electronic industry requires that the chips are packaged in smaller and smaller form factors so that the packaged chips take up less space on a supporting circuitized substrate (such as a printed wiring board, "PWB"). It is also important that the thickness dimension of the packaged chips is reduced so that the same operational circuitry may be fit into a smaller area thereby allowing for more portability (size, weight, etc.) for the resulting finished electronic product and/or allowing for an increase in a product's processing power without also increasing its size. As the packaged chips are made smaller and placed closer and closer together on the PWB, the chips will produce more heat and will receive more heat from the adjacent chips. It is therefore also very important to provide a direct thermal path to facilitate the removal of heat from the packaged chips.

In certain embodiments of U.S. Pat. No. 6,001,671, the disclosure of which is hereby incorporated by reference herein, pads are formed on a sacrificial layer and a semiconductor chip is assembled with the sacrificial layer. After disposing an encapsulant over the microelectronic element and pads, the sacrificial layer is removed, leaving a packaged chip including the pads. The pads are formed on the sacrificial layer by selectively electroplating metal pads onto the sacrificial layer.

Despite this effort in the art, improvements in packaging microelectronic elements are desired.

SUMMARY OF THE INVENTION

One aspect of the present invention is a method of making a reusable mold for forming a microelectronic package, comprising removing material from portions of a base to form recesses in the base. A mask material is deposited in the recesses so as to form a mask attached to the base. The mask desirably remains on the base and is used and re-used in making a plurality of microelectronic packages. Thus, the mask for the mold is made once and re-used.

In certain embodiments, the step of removing material comprises removing material from the base. The base may comprise a metal plate and the step of removing material may comprise etching the plate. The plate may comprise a stainless steel plate and the step of removing material may comprise etching the plate with Ferric Chloride.

In certain preferred embodiments, the method includes providing a first mask on the base. The first mask desirably has openings and material is removed from the portions of the base that are aligned with the openings in the first mask. The mask material deposited in the recesses forms a second mask attached to the base. The base and second mask is desirably used as a reusable mold.

The step of depositing a mask material may comprise utilizing electrophoretic deposition and may include depositing a polymer using electrophoretic deposition.

In certain embodiments, the method includes partially curing the mask material before the step of removing the first mask. The first mask is desirably removed after the step of depositing the mask material. The mask material may be further cured after the step of removing the first mask. The further curing may include applying pressure.

The reusable mold may be used to form a microelectronic package or a plurality of microelectronic packages. After the package is removed from the mold, the mold may be reused. The features formed on the mold remain with the package, after the package is removed from the mold. For example, conductive pads for forming electrical connections are formed on the mold and remain with the package after the package is removed from the mold. In certain preferred embodiments, a mounting pad is also formed on the mold and remains with the package. The mounting pad may be used as a conductive plate, or as a heat spreader for the package, avoiding the need to attach another element, such as a heat spreader, or electrically conductive feature.

In a further aspect, a method of forming a microelectronic package comprises assembling a microelectronic element with a mold having a mask and conductive pads. The microelectronic element is coated with a mass of dielectric material so as to at least partially embed the microelectronic element in the mass of dielectric material. The microelectronic element and conductive pads are removed from the mold so that the mask remains attached to the mold.

In certain preferred embodiments, a base is provided and the conductive pads are formed on a surface of the base. The step of assembling includes adhering the microelectronic element to the surface of the base having the conductive pads.

The step of assembling the microelectronic element may include bonding contacts of the microelectronic element to the conductive pads. In certain embodiments, the microelectronic element is assembled with the mold so that the contacts face away from the base and the conductive pads face the microelectronic element. The contacts may be bonded to the conductive pads, using any method known in the art. In other embodiments, the microelectronic element is assembled with the mold so that the contacts face toward the base. Any other orientation may be used.

In certain embodiments, the step of removing comprises releasing the mass of dielectric material, microelectronic element and conductive pads from the mold. The step of removing may comprise releasing from a surface of the mold that includes a polished surface. The mold may comprise stainless steel. Desirably, the conductive pads are at least partially embedded in the mass of dielectric material so that the conductive pads remain with the package after removing the microelectronic element from the mold.

In certain preferred embodiments, the mold comprises areas for a plurality of microelectronic elements, the step of assembling comprises assembling a first microelectronic element with the mold and the method further includes assembling a second microelectronic element with the mold. The method may also include the step of severing the mass of dielectric material so as to form separate packages after the step of removing. Each microelectronic element may be assembled with the mold at the same time, in the same operation, at different times or in different operations.

In a further aspect of the present invention, a method of forming a microelectronic package comprises assembling a microelectronic element with a mold having a pattern of conductive areas. The microelectronic element is coated with a mass of dielectric material, so as to at least partially embed the microelectronic element in the mass of dielectric material. The microelectronic element and at least some of the conductive areas are removed from the mold.

The step of assembling may comprise disposing the microelectronic element in a mold having raised portions. A mask is desirably formed so that the mask is attached to the mold. In certain embodiments, the method includes applying a pattern of dielectric material so that dielectric material is disposed on the raised portions of the mold. In other embodiments, a pattern of material is deposited on a base so as to form the raised portions.

The method may include depositing a conductive material in at least some of the recessed portions to form the conductive areas. The step of assembling the microelectronic element may comprise disposing the microelectronic element in one of the recessed portions. In other embodiments, conductive material is deposited on the raised portions. The microelectronic element may be disposed in a recessed portion or on a raised portion of the mold.

In certain embodiments, the step of assembling comprises connecting contacts of the microelectronic element to the conductive areas. The step of assembling may include connecting the contacts to conductive areas in at least some of the recessed portions, or on at least some of the raised portions.

In certain embodiments, the method includes mounting a conductive plate over the microelectronic element. The step of mounting may include mounting the conductive plate so that the conductive plate overlies the microelectronic element. Conductive material is disposed on sides of the mold and the conductive plate is disposed on the conductive material on the sides. The step of releasing may include releasing the conductive material from the mold so that the conductive areas and conductive plate substantially surround the microelectronic element. The conductive plate may comprise a material that is thermally conductive, electrically conductive, or both. Preferably, the mask remains attached to the mold, after the microelectronic element and conductive areas are removed.

In another aspect of the present invention, a mold for making a microelectronic package comprises a base having an upper surface having a mask attached thereto. The upper surface defines a plurality of recesses and the recesses comprise bonding recesses for forming conductive pads for the package. The mold may comprise mounting recesses for receiving a microelectronic element.

In a further aspect of the present invention, a mold for making a microelectronic package comprises a plate with an upper surface and a mask comprising a polymeric material embedded in the upper surface of the plate. The plate may include recesses defined in the upper surface of a plate and the polymeric material may be embedded in the recesses. The polymeric material, in certain embodiments, comprises a fluoropolymer. The upper surface of the plate desirably comprises a polished surface. The mask desirably has openings arranged for forming conductive features for the package.

In another aspect of the present invention, a mold for making a microelectronic package comprises a base having an upper surface opening, a plurality of recesses and the recesses comprise bonding recesses for forming conductive pads for the package. The mold may comprise mounting recesses for receiving a microelectronic element.

In a further aspect of the present invention, a microelectronic assembly comprises a microelectronic element having a front face including contacts and a back surface remote therefrom. A mass of dielectric material at least partially encapsulates the microelectronic element so that the encapsulated microelectronic element forms a body having an exterior surface. A mounting pad is exposed at the exterior surface adjacent the back surface of the microelectronic element. Conductive pads are attached to and supported by the mass of dielectric material. The pads, in certain embodiments, extend through the mass of dielectric material and are electrically connected with contacts of the microelectronic element.

BRIEF DESCRIPTION OF THE DRAWINGS

These and other features, aspects and advantages of the present invention will become better understood with regard to the following description, appended claims and accompanying drawings where:

DETAILED DESCRIPTION

Figure 1:
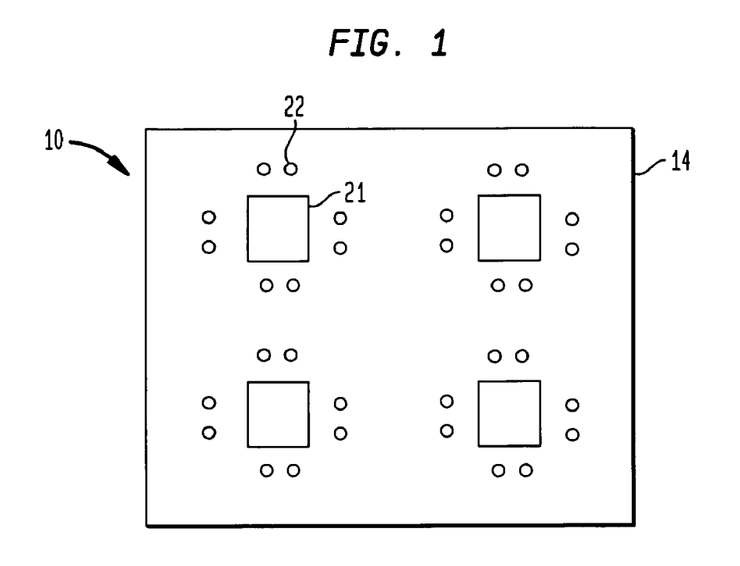
FIG. 1 is a top plan view of a mold in a method in accordance with an embodiment of the invention.

A method of forming a microelectronic package in accordance with an embodiment of the invention is shown in FIGS. 1-8. A mold 10 is provided, comprising a base 12 having a first mask 14 attached to the base 12. The first mask 14 has a plurality of openings arranged for forming conductive features for the package. The first mask 14 has a plurality of openings arranged for forming conductive features for the package. As best seen in FIG. 1, the first mask 14 has a plurality of first openings 21 and second openings 22 arranged so that a group of second openings 22 are associated with each first opening 21. As used herein, terms such as "top", "bottom", "upper" and "lower" are in reference to the particular element or feature and not to any gravitational frame of reference. The figures are not drawn to scale.

Figure 2:
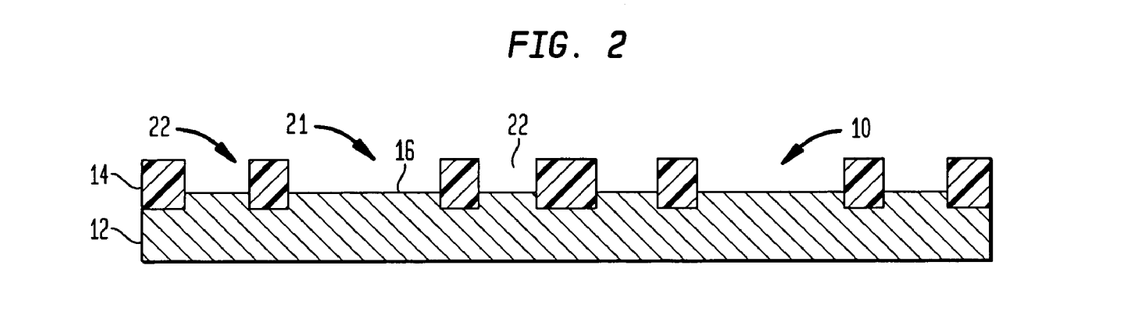
FIG. 2 is a cross-sectional view of a mold in a method in accordance with the embodiment of the invention shown in FIG. 1.

The base 12 desirably comprises a sheet or plate of metal, such as stainless steel. However, other materials, such as polymers may be used. The first mask 14 desirably comprises a polymer, but may comprise any material known for forming a mask, including metals. In a preferred embodiment, the mold 10 comprises a stainless steel plate having a first mask 14 of a fluoropolymer resist embedded in the top surface 16.

Figure 3:
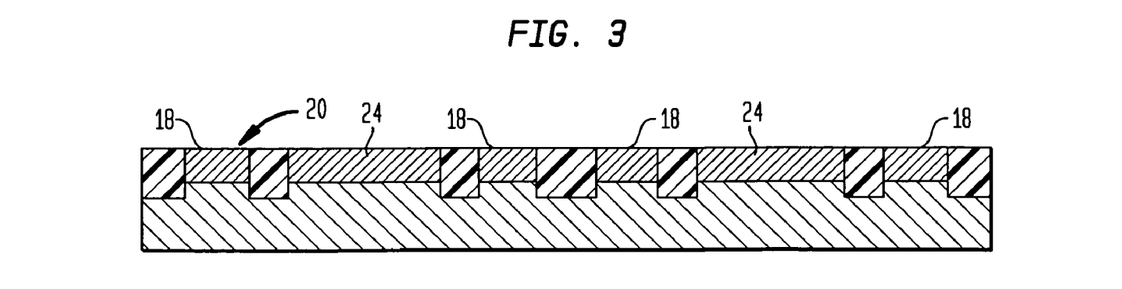
FIG. 3 is a cross-sectional view of a mold in a method in accordance with the embodiment of the invention shown in FIGS. 1-2, at a later stage in the method.

A conductive material 20 is deposited on the top surface 16 of the base 12, in the first openings 21 and second openings 22 of the first mask 14. By depositing the conductive material, a plurality of conductive pads 18 are formed in the second openings 22 and a plurality of mounting pads 24 are formed in the first openings 21. The first mask 14 has openings arranged so that a group of conductive pads 18 is associated with each mounting pad 24. Although the openings 21 and mounting pads 24 are shown having a rectangular shape and openings 22 and conductive pads 18 are shown as having a circular shape, these features may have any regular or irregular shape.

The conductive material may comprise any material for forming electrical connections and may be deposited using any method known in the art. For example, copper, gold, or alloys of copper and gold may be electroplated onto the top surface 16. In preferred embodiments, a layer of palladium is electroplated onto the top surface 16 in the openings 21 and 22 of the mask 14, followed by electroplating a layer of nickel over the layer of palladium and then electroplating a second layer of palladium. In another preferred embodiment, layers of gold, nickel and gold are electroplated in the openings 21 and 22 in the first mask 14.

Figure 4:
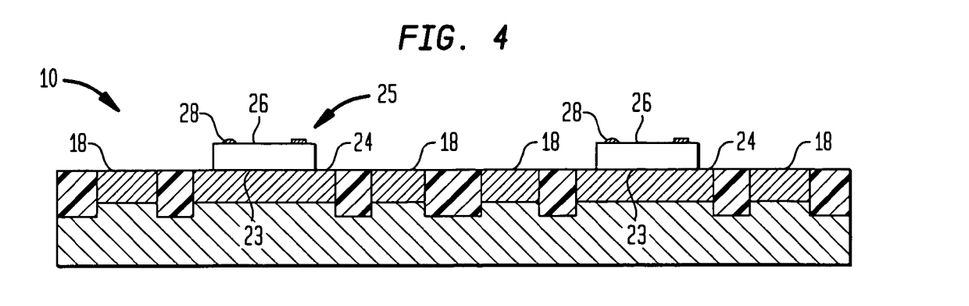
FIG. 4 is a cross-sectional view of a mold in a method in accordance with the embodiment of the invention shown in FIGS. 1-3, at a later stage in the method.
Figure 5:
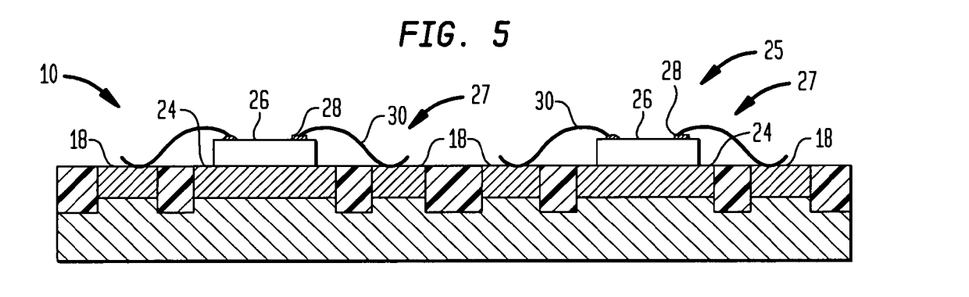
FIG. 5 is a cross-sectional view of a mold in a method in accordance with the embodiment of the invention shown in FIGS. 1-4, at a later stage in the method.

After forming the mounting pads 24 and conductive pads 18, microelectronic elements 25 are attached to the mounting pads 24. The microelectronic elements are attached by adhering one of the microelectronic elements 25 to each of the pads 24. The microelectronic elements 25 may comprise any semiconductor chip, component, layer, wafer, assembly, passive or active components, or groups of elements. For example, a module or stacked assembly may be attached to one or more of the mounting pads 24. In the embodiment shown in FIG. 4, the microelectronic element 25 has an upper surface 26, a lower surface 23, and contacts 28 exposed at the upper surface 26. The lower surface 23 of microelectronic element 25 is desirably adhered to the mounting pad 24 using a thermally conductive adhesive so that the upper surface 26 faces in a direction away from the mold 10. Where thermally conductive adhesive is used, the mounting pad 24 may function as a heat spreader or other heat-conducting feature, as discussed below. As seen in FIG. 4, the conductive pads 18 lie outwardly of the microelectronic element 25.

The contacts 28 of each microelectronic element 25 are bonded to the conductive pads 18 by attaching conductive features to the contacts 28 and the conductive pads 18. The conductive features 27 are desirably used to form connections for signal, power, or any other connections. In the embodiment shown in FIG. 5, wirebonding wires 30 are attached to the conductive pads 18 and contacts 28. Wire bonding is a technique that is well known in the art. In other embodiments, leads or other conductive features 27 are used. The conductive features 27 may comprise any conductive material, such as any metal used in the art, or a conductive polymer.

Figure 6:
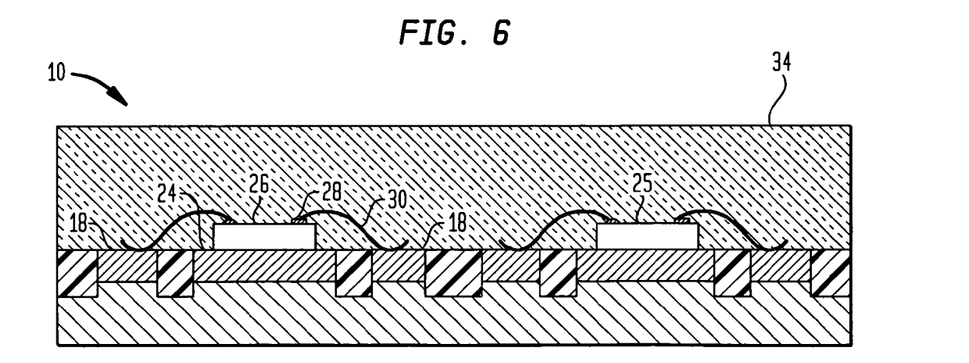
FIG. 6 is a cross-sectional view of a mold in a method in accordance with the embodiment of the invention shown in FIGS. 1-5, at a later stage in the method.

As shown in FIG. 6, the mold 10 and microelectronic elements 25 mounted on the mold 10 are covered with a flowable dielectric material 34. The dielectric material 34 may comprise any overmolding material used in the art, such as thermosetting resins and epoxies. The dielectric material 34 may also comprise an encapsulant, which are materials known in the art. Such materials include thermosetting and thermoplastic materials. The flowable dielectric material 34 is desirably dispensed onto the mold 10 and over the microelectronic elements 25 so as to protect the wires 30 and the connections to the conductive pads 18 and the contacts 28.

Figure 7:
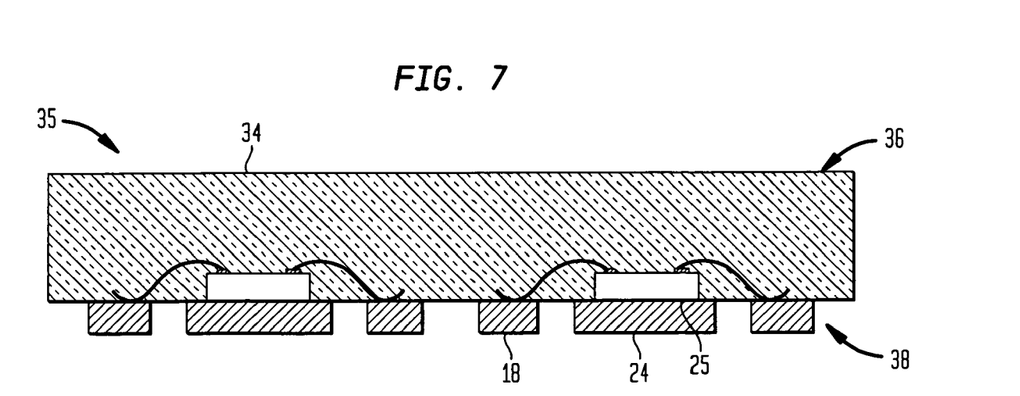
FIG. 7 is a cross-sectional view of an assembly in a method in accordance with the embodiment of the invention shown in FIGS. 1-6, at a later stage in the method.

The dielectric material 34 and microelectronic elements are separated from the mold 10 so that the mounting pads 24 and conductive pads 18 remain attached, forming an assembly 35, as shown in FIG. 7. In removing the mold 10, the first mask 14 remains attached to the base 12 so that the mold 10 is reusable for a plurality of operations similar to those discussed above. The reusable mold reduces the cost of the process of making a microelectronic package, as the step of patterning a mask for forming the conductive pads 18 is eliminated and the mold is reused. As discussed below in connection with FIGS. 9-11, the pattern for the conductive pads is formed once, when the mold is made. As mentioned above, the mold 10 facilitates forming a heat conductive element, such as a mounting pad 24 formed from a heat conducting material. However, in other embodiments, the mounting pad comprises an electrically conductive material, other materials, or is omitted.

As shown in FIG. 7, the assembly 35 has an upper side 36 defined by the dielectric material 34 and a lower side 38. The lower side 38 includes the conductive pads 18 that are attached to the dielectric material 34 and mounting pads 24 that are attached to the microelectronic elements 25 and/or dielectric material 34. The assembly 35 is divided into individual packages 40 by severing the dielectric material 34 between the microelectronic elements 25. (See FIG. 8). Any method of singulation known in the art may be used. For example, the dielectric material 34 between the microelectronic elements 25 may be cut using a laser or blade. In other embodiments, the mold has openings for one microelectronic element and the mold forms a single package or assembly.

Figure 8:
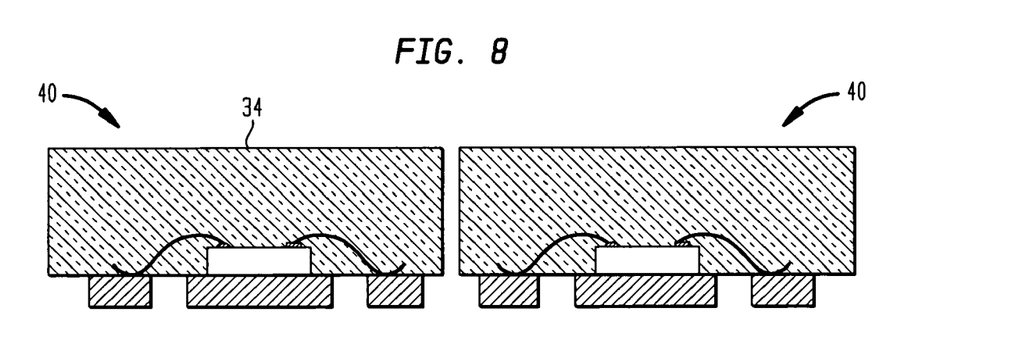
FIG. 8 is a cross-sectional view of packages in a method in accordance with the embodiment of the invention shown in FIGS. 1-7, at a later stage in the method.

Each package 40 can be assembled with external circuitry, such as another package, circuit board or any other element. For example, the conductive pads 18 may be bonded to bonding pads on a circuit board and the mounting pad 24 may be bonded to a heat sink, power or ground connections of a circuit board. One method of bonding the packages to external circuitry is disposing solder balls between the conductive pads of the package and pads on the external circuitry. Other known methods may be used. The conductive pads 18 shown in the figures, as well as the other features shown, are not drawn to scale.

The conductive pads discussed above may be formed as disclosed in certain embodiments of U.S. Pat. No. 6,001,671, the disclosure of which is hereby incorporated by reference herein. Other features disclosed in U.S. Pat. No. 6,001,671 may be incorporated in the method, the package, and mold discussed above. For example, the conductive pad may be arranged so as to extend upwardly so that a portion of the pad is exposed at an upper surface of the mass of dielectric material.

In further embodiments, a microelectronic element is assembled with the mold so that the upper surface of the microelectronic element and the contacts face the mold. The contacts may be bonded to the conductive pads 18 using solder or some other bonding material. In such embodiments, the mounting pads 24 shown in FIGS. 4 and 5 may be smaller, or may be omitted, and the conductive pads 18 are desirably disposed underneath the upper surface of the microelectronic element. An underfill or a compliant pad may be disposed between the upper surface of the microelectronic element and the mold, either before or after the step of bonding. A compliant material may also be disposed between the microelectronic element 25 and mold 10 discussed above in connection with FIGS. 1-8. The compliant layer disclosed in certain embodiments of U.S. Pat. Nos. 5,679,977; 5,148,266; and 5,148,265, the disclosures of which are hereby incorporated by reference herein, may be used.

In other embodiments, assemblies of microelectronic elements are formed by severing the dielectric material between some but not all of the microelectronic elements. Certain embodiments include electronically interconnecting microelectronic elements. For example, some conductive features may be connected to certain contacts of one microelectronic element and to certain contacts of another microelectronic element. The contacts of two or more microelectronic elements may be connected to the same conductive pad. Such an assembly may comprise a module incorporating various microelectronic components. In one embodiment, a first microelectronic element is stacked with a second microelectronic element and the pair of stacked microelectronic elements are disposed in the mold. Two or more microelectronic elements may be arranged side by side in the mold. See FIGS. 26, 27 and 28, discussed below.

In other embodiments, the pad 24 is omitted and the lower surface of the microelectronic element is exposed after the step of releasing.

In other embodiments, the mounting pads 24 comprise a material different from the conductive pads 18, including metals and any other materials. In certain embodiments, the mounting pads 24 comprise a heat conducting material. In certain embodiments, the mounting pads comprise a polymeric material, such as an elastomer or epoxy. In certain preferred embodiments, the mounting pads comprise a compliant material.

Figure 9:
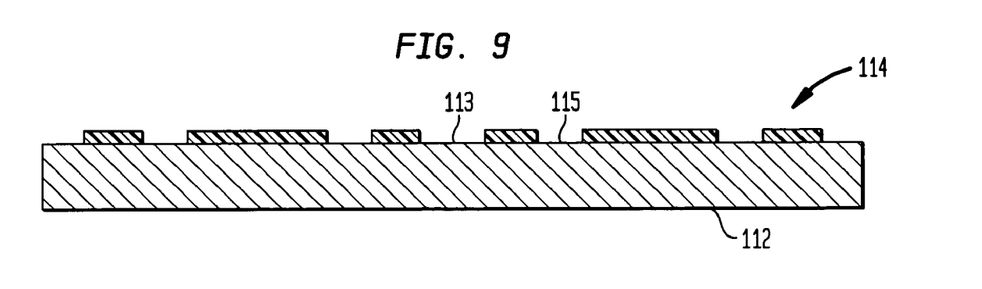
FIG. 9 is a cross-sectional view of a base and first mask in a method in accordance with another embodiment of the invention.
Figure 10:
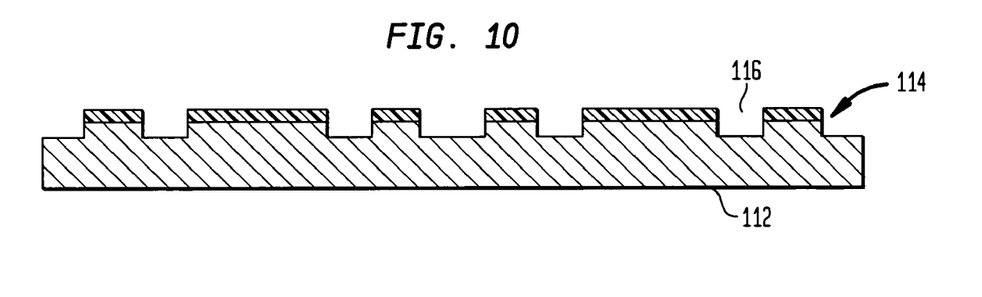
FIG. 10 is a cross-sectional view of a base in a method in accordance with the embodiment of the invention shown in FIG. 9, at a later stage in the method.
Figure 11:
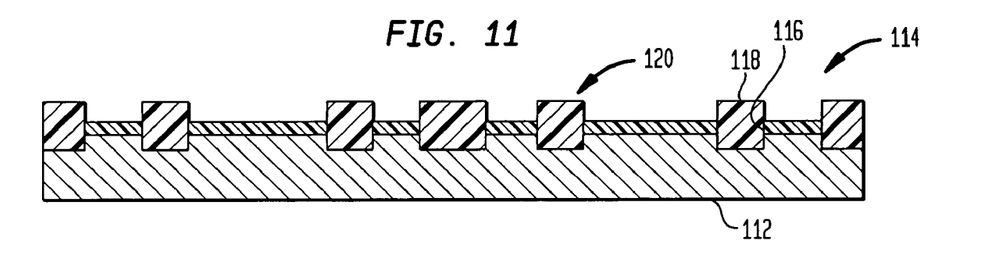
FIG. 11 is a cross-sectional view of a base in a method in accordance with the embodiment of the invention shown in FIGS. 9-10, at a later stage in the method.

A method of making a mold according to a further embodiment is shown in FIGS. 9-11. Molds made according to the embodiment shown in FIGS. 9-11 comprise one type of mold that may be used in methods according to the embodiment shown in FIGS. 1-8, or the embodiments discussed below.

A mask 114 is applied to a top face 113 of a base 112, as shown in FIG. 9. The mask 114 may comprise a photoresist that is applied to the top face 113 and patterned to form openings 115, using techniques known in the art. The base 112 desirably comprises a stainless steel plate, although other materials, including polymers, may be used.

As shown in FIG. 10, material is removed from portions of the top face 113 of the base 112 that are aligned with the openings 115, leaving recesses 116 in the base 112. Material is desirably removed from the top face 113 by etching the top face 113 of the base 112. In etching the top face 113, an etchant is allowed to attack the top face 113, removing material from the base 112. The etchant attacks the base 112, until recesses 116 have been formed, and then the etching is arrested by rinsing the base 112 of the etchant, as known in photolithography and other methods known in the art. In embodiments in which a stainless steel base is used, the etchant used may comprise Ferric Chloride. In other embodiments, other etchants may be used and, in still further embodiments, other methods for removing material, such as cutting with a laser or blade, may be used.

A mask material 118 is deposited in the recesses 116 in the base 112, as shown in FIG. 11, to form the mask 120. The mask material 118 desirably comprises a polymer that is electrophoretically deposited in the recesses 116. For example, a fluoropolymer may be deposited electrophoretically as the mask material 118. However, in other embodiments, other materials and methods may be used to deposit a mask material 118 on the base 112. Preferably, the second mask 114 remains on the base 112 while the mask material 118 is deposited in the recesses 116. The mask material 118 is at least partially cured to form the mask 120.

Figure 12:
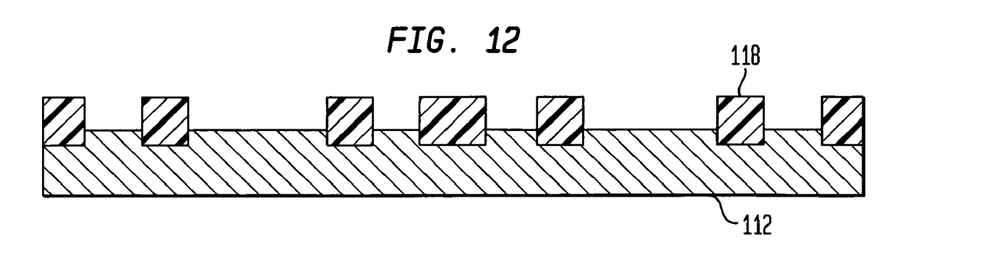
FIG. 12 is a cross-sectional view of a mold in a method in accordance with the embodiment of the invention shown in FIGS. 9-11, at a later stage in the method.

As shown in FIG. 12, the mask 114 is stripped from the base 112 after the mask material 118 is deposited and cured. Methods of rinsing or stripping photoresist and other masks are known in the art. The mask 120 may be fully cured after the mask 114 is stripped. The curing of the mask 120 may include curing in a lamination press to apply heat and/or pressure. Desirably, the mask 120 comprises a durable and long-lasting material so that the mold 110 can be used in a plurality of operations. For example, in embodiments in which a curable material is used as the mask material 118, the curing is desirably conducted until the mask material 118 has a sufficient density or durability and so that the mold 110 is suited for repeated use.

Molds in accordance with the present invention may be used in methods for forming microelectronic packages disclosed in certain embodiments of U.S. Pat. Nos. 6,001,671; 6,294,830; 6,093,584, as well as U.S. patent application Ser. No. 09/732,821, filed Dec. 8, 2000; Ser. No. 09/784,965, filed Feb. 16, 2001; Ser. No. 09/732,821, filed Dec. 8, 2000; and Ser. No. 09/950,761, filed Sep. 12, 2001. The disclosures of all the aforementioned patents and patent applications are hereby incorporated by reference herein. The packages and assemblies disclosed in the aforementioned patents and applications may be made using methods in accordance with embodiments of the present invention.

In other embodiments of making a mold, a mask is adhered to the surface of a base, such as a polymeric mask attached to the surface of a base using an adhesive. The mask is desirably attached to the base so that the mask is formed once and used with the mold in multiple operations. The base may comprise flexible materials to facilitate separation of the mold from the microelectronic packages. Desirably, the materials of the mold are selected to minimize adhesion to the conductive material or other materials deposited in or on the first mask.

Figure 13:
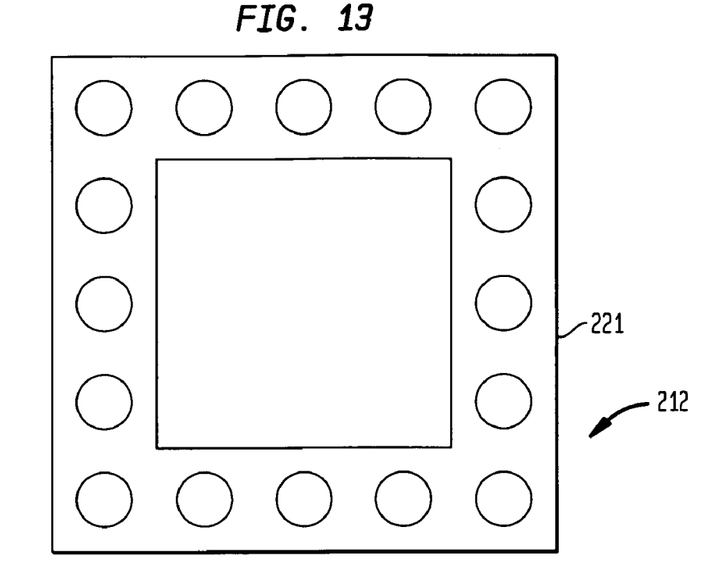
FIG. 13 is a schematic top plan view of a mold in a method in accordance with a further embodiment of the invention.
Figure 14:
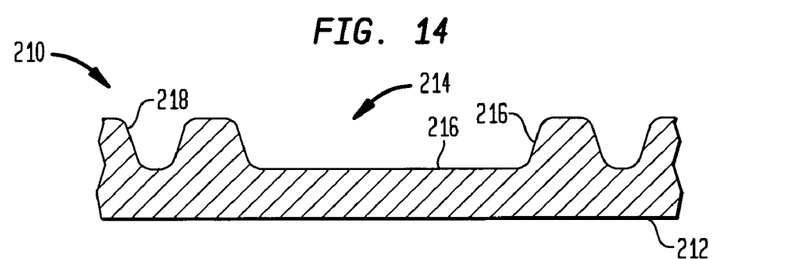
FIG. 14 is a cross-sectional view of the mold in a method in accordance with the embodiment of the invention shown in FIG. 13.

In certain embodiments, the mold comprises a base having recesses and protrusions in the top surface of the base. A method of making a microelectronic package using such a mold is shown in FIGS. 13-21. The mold 210 comprises a base 212 similar to the base 112 discussed above. The base 212 has a plurality of recesses 214 formed in an upper surface 217 of the base 212. The recesses 214 include mounting recesses 216 and bonding recesses 218. As seen in FIG. 13, a plurality of bonding recesses 218 are associated with a mounting recess 216. The base 212 desirably includes a plurality of mounting recesses 216 for receiving microelectronic elements 225, and bonding recesses 218 associated with each mounting recess 216. However, a base 212 for a single microelectronic element 225 may also be used. The base 212 and recesses 214 may be formed by stamping, molding, etching, or any other process known in the art.

Figure 15:
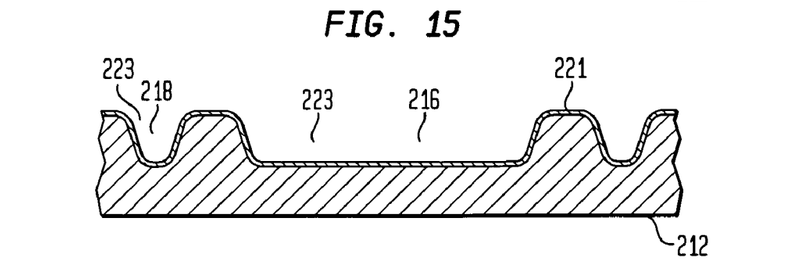
FIG. 15 is a cross-sectional view of the mold in a method in accordance with the embodiment of the invention shown in FIGS. 13-14, at a later stage in the method.
Figure 16:
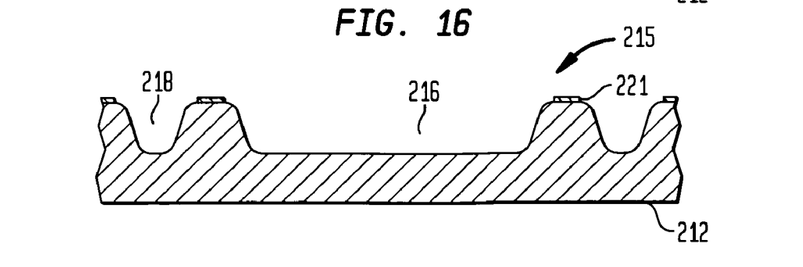
FIG. 16 is a cross-sectional view of the mold in a method in accordance with the embodiment of the invention shown in FIGS. 13-15, at a later stage in the method.

As shown in FIG. 15, the upper surface 216 is coated with a dielectric material 221, using methods known in the art. A preferred material for the dielectric material 221 is diamond, which may be deposited or formed using chemical or plasma vapor deposition, or using other methods known in the art. Teflon (trademark of E.I. du Pont), or any other dielectric materials may be used. Portions 223 of the dielectric material 221 aligned with the recesses 214 are removed, as shown in FIG. 16. Laser ablation, etching, chemical processes or other methods may be used to remove portions 223. The dielectric material 221 remaining on the base 212 forms a mask 215 for the mold.

Figure 17:
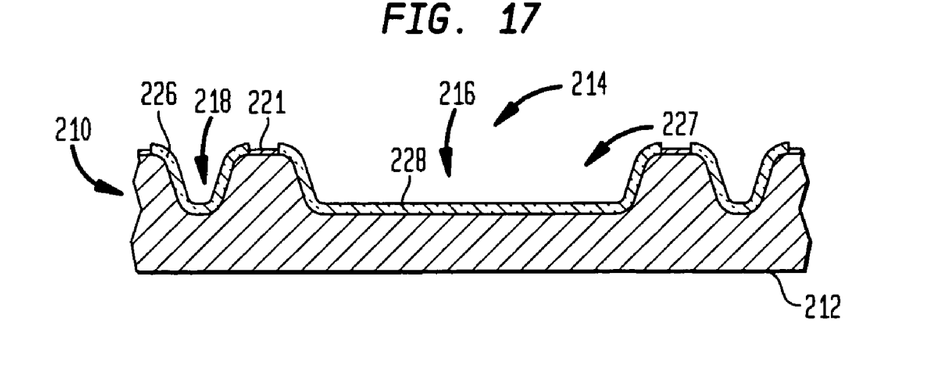
FIG. 17 is a cross-sectional view of the mold in a method in accordance with the embodiment of the invention shown in FIGS. 13-16, at a later stage in the method.

A conductive material 227 is deposited on the upper surface 216 of the base 212, such as by electroplating layers of copper, nickel, and gold onto the recesses 214 in the plate. The conductive material 227 is not deposited onto the dielectric material 221 during the electroplating so that separate conductive pads 226 are formed in the bonding recesses 218 and a mounting pad 228 is formed in the mounting recess 216 on the base 212, as shown in FIG. 17. In other embodiments, other conductive materials and other methods of depositing the conductive materials may be used.

Figure 18:
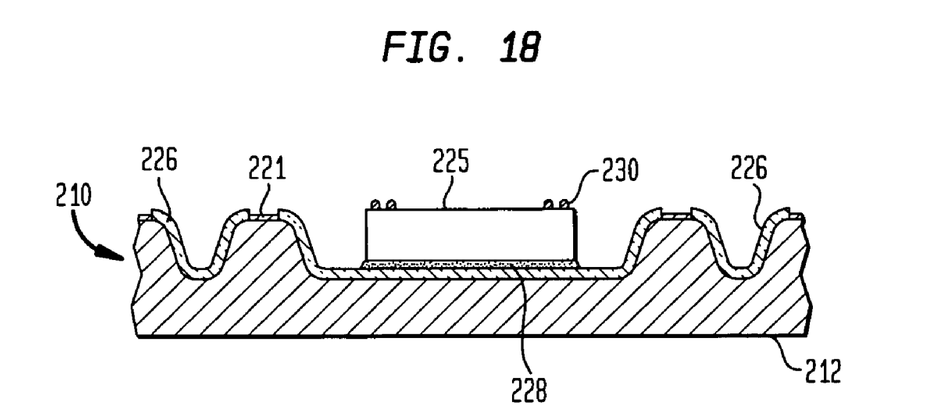
FIG. 18 is a cross-sectional view of the mold in a method in accordance with the embodiment of the invention shown in FIGS. 13-17, at a later stage in the method.

A microelectronic element 225 is disposed on the mounting pad 228 and desirably adhered to the mounting pad 228 using an adhesive. (FIG. 18). In certain embodiments, the mounting pad 228 comprises a heat spreader and the microelectronic element 225 is adhered using a thermally conductive adhesive.

Figure 19:
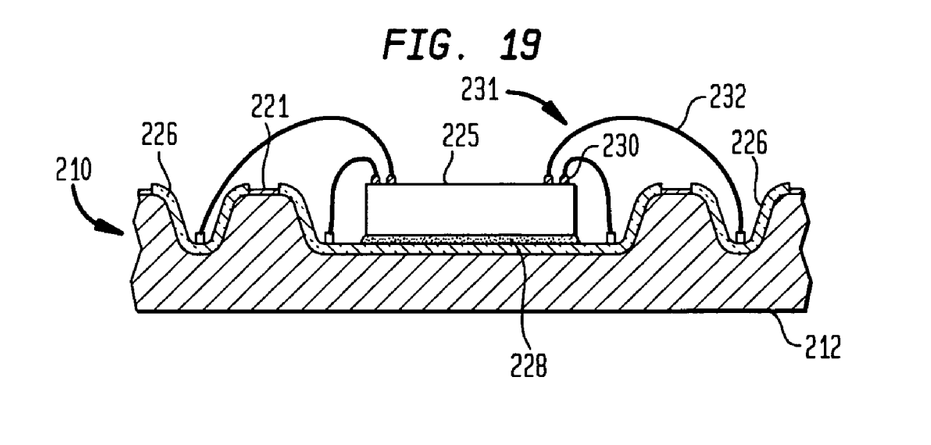
FIG. 19 is a cross-sectional view of the mold in a method in accordance with the embodiment of the invention shown in FIGS. 13-18, at a later stage in the method.

Contacts 230 of the microelectronic element 225 are bonded to the conductive pads 226 by attaching conductive features 231 to the contacts 230 and the conductive pads 226. Wirebonding wires 232 are attached to the conductive pads 226 and contacts 230 in the embodiment shown in FIG. 19. In other embodiments, leads or other conductive features are used. The conductive features may comprise any metal known in the art, or a conductive polymer. The conductive features 231 are desirably used to form connections for signal, power, and/or other connections. In certain embodiments, the mounting pad 228 comprises a power plane, ground plane or other conductive plane for the package. In other embodiments, the mounting pad comprises other materials or is omitted. In certain embodiments, at least some of the contacts 230 are bonded to the mounting pad 228, as seen in FIG. 19. At least some of the contacts 230 are bonded to the conductive pads 226, which are separated from the mounting pad 228 by the dielectric material 221.

Figure 20:
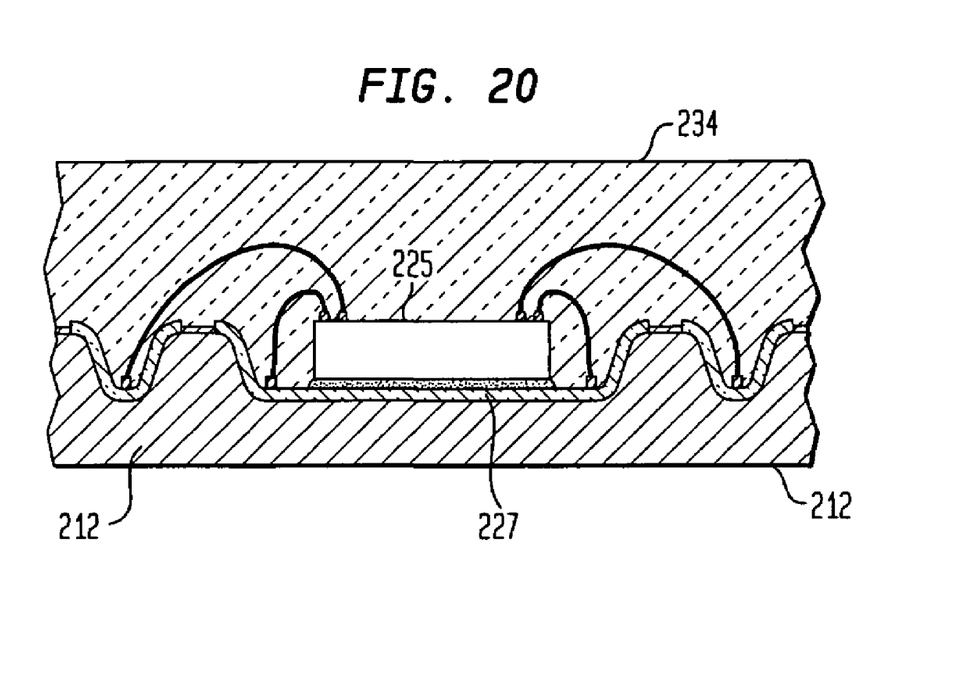
FIG. 20 is a cross-sectional view of the mold in a method in accordance with the embodiment of the invention shown in FIGS. 13-19, at a later stage in the method.
Figure 21:
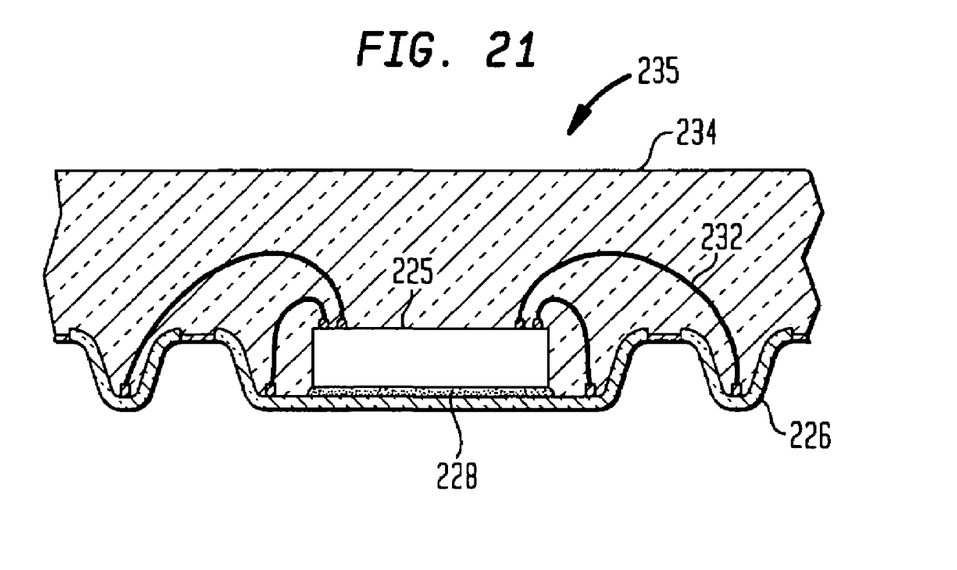
FIG. 21 is a cross-sectional view of the mold in a method in accordance with the embodiment of the invention shown in FIGS. 13-20, at a later stage in the method.
Figure 22:
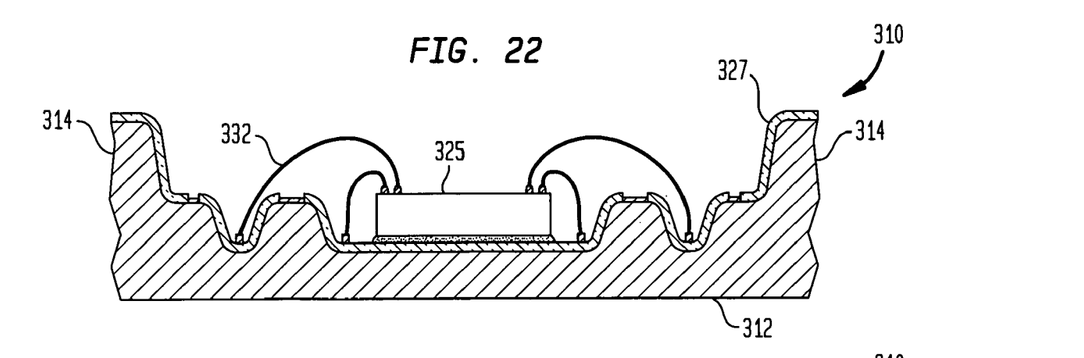
FIG. 22 is a cross-sectional view of a mold in a method in accordance with a further embodiment of the invention.

As shown in FIG. 20, a flowable dielectric material 234 is disposed over the microelectronic element 225, as discussed above in connection with FIGS. 1-8. The conductive material 227 is deposited on the base 212 so that the conductive material 227 does not significantly adhere to the base 212. As shown in FIG. 21, the mold 210 is separated from the conductive material 227 and a package 235 remains. The package 235 includes the microelectronic element 225, mounting pad 228, conductive pads 226, wires 232 and dielectric material 234. The mold 210 is reusable in a method of making a further microelectronic element or further microelectronic elements similar to the method discussed above. The dielectric material 221 desirably remains on the base 212 so that the mask 215 for the mold need not be formed again, saving cost and time. The package 235 can be assembled with external circuitry, such as another package, circuit board or any other element. For example, the conductive pads 226 may be bonded to bonding pads on a circuit board and the mounting pad 228 may be bonded to a heat sink, power or ground connections of a circuit board.

Figure 23:
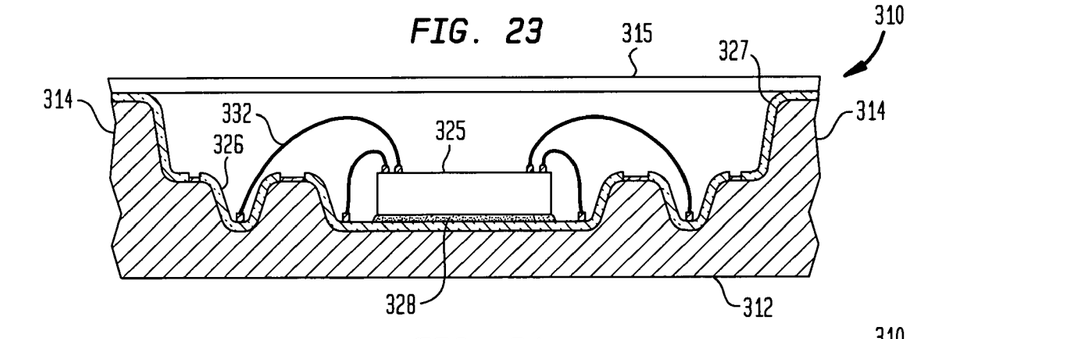
FIG. 23 is a cross-sectional view of a mold in a method in accordance with the embodiment of FIG. 22, at a later stage in the method.
Figure 24:
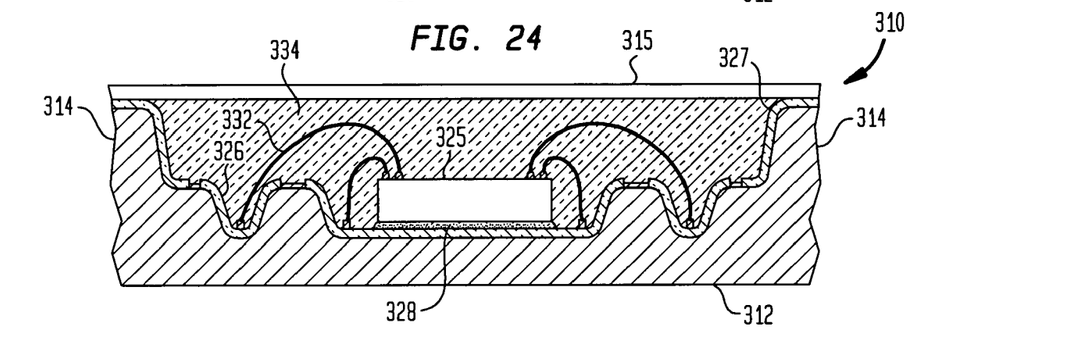
FIG. 24 is a cross-sectional view of a mold in a method in accordance with the embodiment of FIGS. 22-23, at a later stage in the method.
Figure 25:
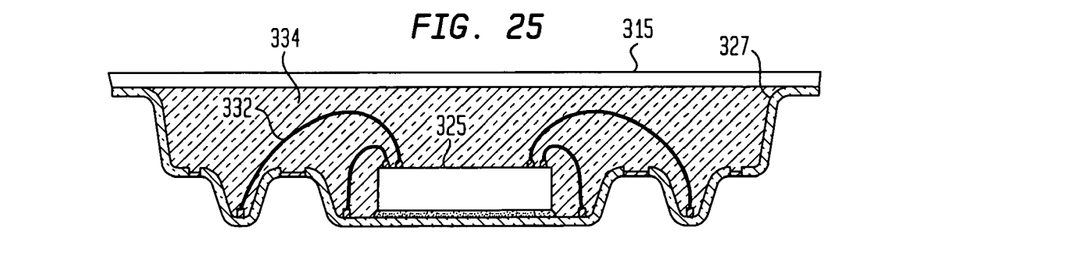
FIG. 25 is a cross-sectional view of a mold in a method in accordance with the embodiment of FIGS. 22-24, at a later stage in the method.

In a further embodiment of the invention shown in FIGS. 22-25, the base 313 of the mold 310 comprises sides 314 that extend upwardly with respect to the microelectronic element or elements 325, when such element or elements are assembled with the base 313. The method of forming a package is conducted substantially as discussed above in connection with FIGS. 13-21. However, as shown in FIG. 23, a second plate 315 is attached to conductive material 327 on the sides 314 of the base 313 after the microelectronic element 325 is attached to the conductive pads 326 and mounting pad 328. The dielectric material 334 is disposed around the microelectronic element 325 and wires 332, between the conductive pads 326 and mounting pad 328 on one side and the second plate 315 on the other side. The base 313 is then released from the conductive material 327 so that a package 340 is formed. The package may be connected to external circuitry as discussed above.

Figure 26:
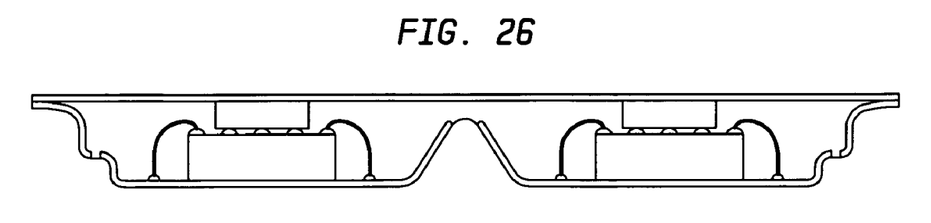
FIG. 26 is a cross-sectional view of a package in a method in accordance with a further embodiment of the invention.
Figure 27:
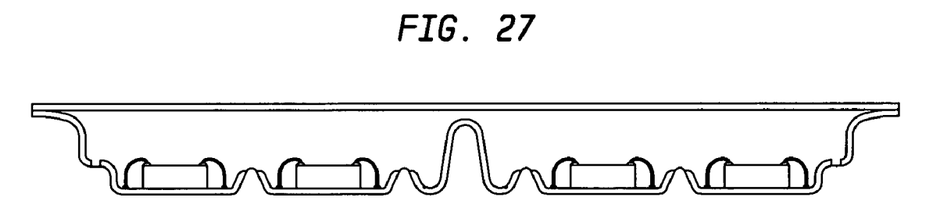
FIG. 27 is a cross-sectional view of a package in a method in accordance with another embodiment of the invention.
Figure 28:
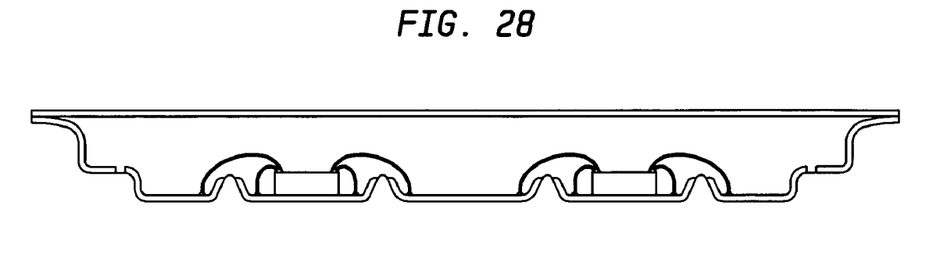
FIG. 28 is a cross-sectional view of a package in a method in accordance with another embodiment of the invention.

Further embodiments are depicted in FIGS. 26-28, in which a microelectronic package having more than one microelectronic element is formed. Packages such as the packages disclosed in certain embodiments of U.S. Provisional Application No. 60/315,408, filed Aug. 28, 2001 and U.S. patent application Ser. No. 10/210,160, filed Aug. 1, 2002, the disclosures of which are hereby incorporated by reference herein, may be made using methods according to embodiments of the invention discussed above.

Although the invention herein has been described with reference to particular embodiments, it is to be understood that these embodiments are merely illustrative of the principles and applications of the present invention. For example, certain embodiments discussed above include depositing metal in recesses or openings of a mold. The deposited metal may include a mounting pad. In other embodiments, the metal comprises a pattern of conductors for traces or other features. The openings or recesses in the mold may be formed for this purpose. In addition, other methods for connecting the contacts of the microelectronic element may be used, such as leads, or bonding materials (such as solder) and the microelectronic element may be oriented in a face-up, face-down, or other orientation. It is therefore to be understood that numerous modifications may be made to the illustrative embodiments and that other arrangements may be devised without departing from the spirit and scope of the present invention as defined by the appended claims.

The invention claimed is:

1. A method of making a reusable mold for forming a microelectronic package, comprising:
   removing material from portions of a base to form first recesses having a first size and second recesses having a second size said second size being different than said first size, wherein a plurality of second recesses are associated with at least one first recess in said base; and then
   depositing a mask material on at least some portions of said base so as to form a mask attached to said base.

2. The method of claim 1, wherein the step of removing material comprises removing material from said base and wherein said base comprises a metal plate.

3. The method of claim 2, wherein the step of removing comprises etching said metal plate with Ferric Chloride and wherein said base comprises a stainless steel plate.

4. The method of claim 1, wherein the step of removing material comprises etching said base.

5. A method of making a reusable mold for forming a microelectronic package, comprising:
   removing material from portions of a base to form first recesses having a first size and second recesses having a second size said second size being different than said first size, wherein a plurality of second recesses are associated with at least one first recess in said base;
   depositing a mask material on at least some portions of said base so as to form a mask attached to said base; and
   providing an additional mask having openings on said base,
   wherein the step of removing material comprises removing material from said portions of said base that are aligned with said openings in said additional mask.

6. The method of claim 5, wherein the step of providing an additional mask comprises depositing a photoresist on said base and patterning said photoresist so as to form openings in said photoresist.

7. The method of claim 1, wherein the step of depositing a the mask material comprises utilizing electrophoretic deposition.

8. The method of claim 7, wherein the step of depositing the mask material comprises depositing a polymer utilizing electrophoretic deposition.

9. The method of claim 5, further comprising removing portions of said additional mask to form said openings in said additional mask, wherein said mask material is partially cured before the step of removing said additional mask.

10. The method of claim 9, further comprising removing portions of said additional mask after the step of depositing the mask material.

11. The method of claim 10, further comprising further curing of said mask material after the step of removing said additional mask.

12. The method of claim 11, wherein the further curing includes applying pressure.

* * * * *

UNITED STATES PATENT AND TRADEMARK OFFICE
CERTIFICATE OF CORRECTION

| | | |
|---|---|---|
| PATENT NO. | : 7,309,447 B2 | Page 1 of 1 |
| APPLICATION NO. | : 10/771252 | |
| DATED | : December 18, 2007 | |
| INVENTOR(S) | : David Light and Masud Beroz | |

It is certified that error appears in the above-identified patent and that said Letters Patent is hereby corrected as shown below:

Column 12, line 29 delete "a".

Signed and Sealed this

Ninth Day of December, 2008

JON W. DUDAS
*Director of the United States Patent and Trademark Office*